US010243039B2

(12) United States Patent
Bolotnikov et al.

(10) Patent No.: US 10,243,039 B2
(45) Date of Patent: Mar. 26, 2019

(54) SUPER-JUNCTION SEMICONDUCTOR POWER DEVICES WITH FAST SWITCHING CAPABILITY

(71) Applicant: General Electric Company, Schenectady, NY (US)

(72) Inventors: Alexander Viktorovich Bolotnikov, Niskayuna, NY (US); Peter Almern Losee, Clifton Park, NY (US); David Alan Lilienfeld, Niskayuna, NY (US); Reza Ghandi, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/077,579

(22) Filed: Mar. 22, 2016

(65) Prior Publication Data
US 2017/0278924 A1      Sep. 28, 2017

(51) Int. Cl.
*H01L 21/04*      (2006.01)
*H01L 29/06*      (2006.01)
(Continued)

(52) U.S. Cl.
CPC ........ *H01L 29/0634* (2013.01); *H01L 21/046* (2013.01); *H01L 29/0619* (2013.01); *H01L 29/1608* (2013.01); *H01L 29/6606* (2013.01); *H01L 29/66068* (2013.01); *H01L 29/66136* (2013.01); *H01L 29/66143* (2013.01); *H01L 29/66272* (2013.01); *H01L 29/66909* (2013.01); *H01L 29/73* (2013.01); *H01L 29/732* (2013.01);
(Continued)

(58) Field of Classification Search
None
See application file for complete search history.

(56) References Cited

U.S. PATENT DOCUMENTS 4,797,721 A  *  1/1989  Hsu ................... H01L 29/78609
                                                                257/354
4,965,872 A  *  10/1990  Vasudev ............. H01L 27/0688
                                                                257/350

(Continued)

FOREIGN PATENT DOCUMENTS

| JP | 2001313393 A | 11/2001 |
| JP | 2005005385 A | 1/2005 |
| WO | 2017/021489 A1 | 6/2017 |

OTHER PUBLICATIONS

U.S. Appl. No. 14/752,446, filed Jun. 26, 2015, Losee et al.
(Continued)

*Primary Examiner* — Erik Kielin
(74) *Attorney, Agent, or Firm* — GE Global Patent Operation; John Darling

(57) ABSTRACT

A super junction (SJ) device may include one or more charge balance (CB) layers. Each CB layer may include an epitaxial (epi) layer having a first conductivity type and a plurality of charge balance (CB) regions having a second conductivity type. Additionally, the SJ device may include a connection region having the second conductivity type that extends from a region disposed in a top surface of a device layer of the SJ device to one or more of the CB regions. The connection region may enable carriers to flow directly from the region to the one or more CB regions, which may decrease switching losses of the SJ device.

12 Claims, 6 Drawing Sheets

(51) Int. Cl.
*H01L 29/16* (2006.01)
*H01L 29/66* (2006.01)
*H01L 29/73* (2006.01)
*H01L 29/78* (2006.01)
*H01L 29/732* (2006.01)
*H01L 29/808* (2006.01)
*H01L 29/861* (2006.01)
*H01L 29/872* (2006.01)

(52) U.S. Cl.
CPC .......... *H01L 29/78* (2013.01); *H01L 29/7802* (2013.01); *H01L 29/808* (2013.01); *H01L 29/8083* (2013.01); *H01L 29/861* (2013.01); *H01L 29/872* (2013.01)

(56) References Cited

U.S. PATENT DOCUMENTS

| | | | |
|---|---|---|---|
| 5,965,921 A * | 10/1999 | Kojima | H01L 27/0922 257/341 |
| 6,037,632 A | 3/2000 | Omura et al. | |
| 6,066,878 A | 5/2000 | Neilson | |
| 6,274,904 B1 * | 8/2001 | Tihanyi | H01L 29/0634 257/256 |
| 6,903,373 B1 | 6/2005 | Lotfi et al. | |
| 6,979,863 B2 | 12/2005 | Ryu | |
| 7,067,361 B2 | 6/2006 | Allen et al. | |
| 8,933,463 B2 | 1/2015 | Adachi et al. | |
| 9,040,377 B2 | 5/2015 | Sdrulla et al. | |
| 2002/0117715 A1 * | 8/2002 | Oppermann | H01L 29/0634 257/339 |
| 2008/0001198 A1 * | 1/2008 | Jeon | H01L 29/0634 257/298 |
| 2008/0014693 A1 | 1/2008 | Matocha | |
| 2008/0099837 A1 * | 5/2008 | Akiyama | H01L 29/0623 257/341 |
| 2008/0303082 A1 | 12/2008 | Zara | |
| 2009/0280609 A1 | 11/2009 | Akiba et al. | |
| 2014/0110779 A1 | 4/2014 | Tamaki | |
| 2014/0264477 A1 | 9/2014 | Bhalla et al. | |
| 2015/0084124 A1 | 3/2015 | Saito et al. | |
| 2015/0129895 A1 | 5/2015 | Takeuchi et al. | |
| 2016/0099684 A1 * | 4/2016 | Qiu | H03F 1/0205 330/307 |
| 2017/0084734 A1 * | 3/2017 | Tegen | H01L 29/7811 |

OTHER PUBLICATIONS

Funaki, T., et al.; "Evaluation of High Frequency Switching Capability of SiC Schottky Barrier Diode, Based on Junction Capacitance Model;" Power Electronics, IEEE Transactions on, vol. 23, Issue: 5, pp. 2602-2611, Sep. 2008.

Wada, K, et al.; "Fast switching 4H-SiC V-groove trench MOSFETs with buried P+ structure;" Power Semiconductor Devices & IC's (ISPSD), 2014 IEEE 26th International Symposium on, pp. 225-228, Jun. 2014.

PCT Search Report and Written Opinion issued in connection with corresponding PCT Application No. PCT/US2017/021489 dated May 24, 2017.

* cited by examiner

SUPER-JUNCTION SEMICONDUCTOR POWER DEVICES WITH FAST SWITCHING CAPABILITY

BACKGROUND

The subject matter disclosed herein relates to semiconductor power devices and, more specifically, to super-junction (SJ) semiconductor power devices.

For semiconductor power devices, super-junction (also referred to as charge balance) designs offer several advantages. For example, super-junction devices demonstrate reduced resistance and reduced conduction losses per unit area relative to traditional unipolar device designs. However, the switching speed of super-junction devices utilizing floating regions depends on the recombination-generation rates of the carriers in the semiconductor material. For some semiconductor materials, such as wide band gap materials, the recombination-generation rates may be relatively low and may result in undesirable switching speeds. To increase the recombination-generation rates and the switching speed of such super-junction devices, point defects may be introduced into the semiconductor material. However, the point defects may increase the leakage current of the device. Accordingly, it may be desirable to develop super-junction device designs with floating regions that have high switching speed without substantially increasing the leakage current.

BRIEF DESCRIPTION

In one embodiment, a super junction (SJ) device includes a device layer having a first conductivity type. The device layer includes a top region having a second conductivity type disposed in a top surface of the device layer. Additionally, the SJ device includes a first charge balance (CB) layer having the first conductivity type disposed adjacent to the device layer. The first CB includes a first plurality of charge balance (CB) regions having the second conductivity type. Further, the SJ device includes a first connection region having the second conductivity type disposed in the device layer and the first CB layer. The first connection region extends from the top region of the device layer to at least a first CB region of the first plurality of CB regions of the first CB layer.

In one embodiment, a super junction (SJ) device includes at least one epitaxial (epi) layer having a first conductivity type that includes a plurality of charge balance (CB) regions having a second conductivity type to form at least one charge balance (CB) layer. A thickness of each of the plurality of CB regions is less than a thickness of the at least one CB layer. Additionally, the SJ device includes a top epitaxial layer having the first conductivity type disposed adjacent to the at least one CB layer to form a device layer. The device layer includes a top region having the second conductivity type. Further, the SJ device includes a connection region having the second conductivity type. The connection region extends from the top region of the device layer to at least one of the plurality of CB regions of the at least one CB layer.

In one embodiment, a method of manufacturing a super junction (SJ) device includes forming a first semiconductor layer having a first conductivity type on top of a semiconductor substrate layer. The first semiconductor layer is formed from a wide band gap material. Additionally, the method includes implanting a first plurality of charge balance (CB) regions having a second conductivity type into the first semiconductor layer. Further, the method includes forming a second semiconductor layer having the first conductivity type above the first semiconductor layer. The method also includes implanting a connection region having the second conductivity type into the second semiconductor layer. The connection region extends through the second semiconductor layer to at least a first CB region of the first plurality of CB regions. Further, the method includes implanting a top region having the second conductivity type into the second semiconductor layer adjacent to the connection region. The connection region extends from the top region to the first CB region of the first plurality of CB regions.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
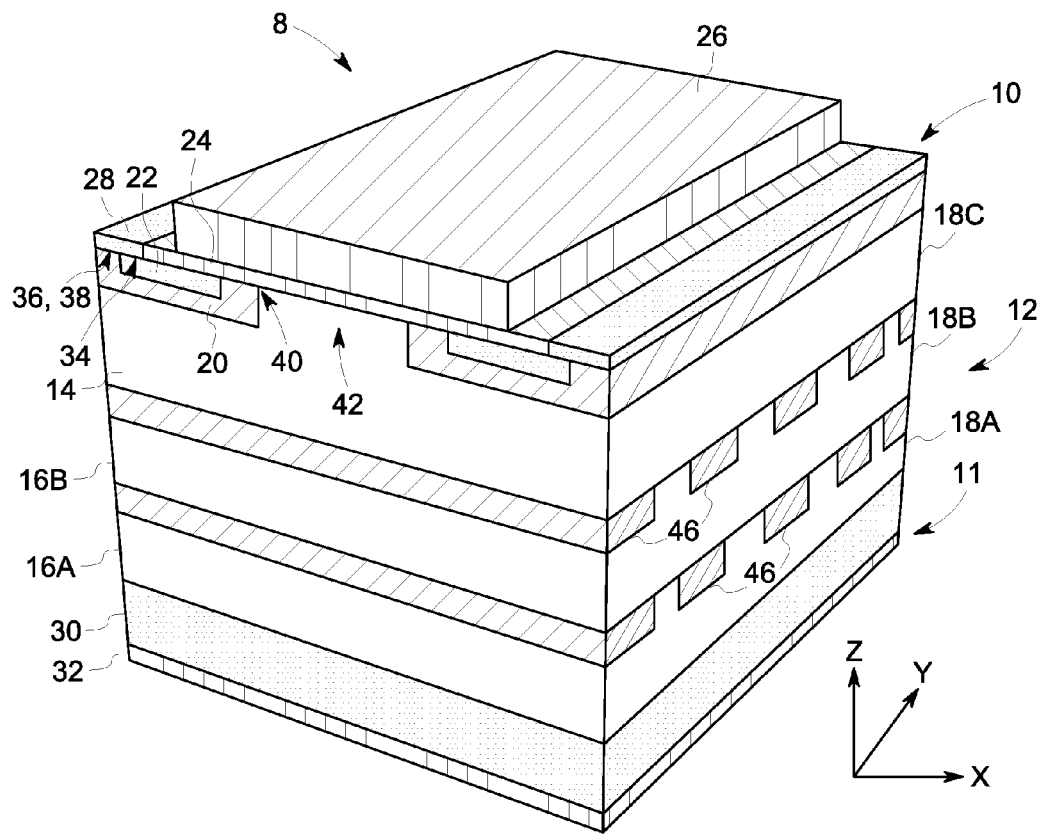
FIG. 1 illustrates a perspective view of a super junction (SJ) metal-oxide-semiconductor field-effect transistor (MOSFET) device that includes a plurality of charge balance (CB) layers, each having a plurality of charge balance (CB) regions, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer/region is being described as "on" another layer or substrate, it is to be understood that the layers/regions can either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer.

Present embodiments are directed toward designs and methods of manufacturing vertical semiconductor charge-balance (CB) devices, also referred to as semiconductor super-junction (SJ) devices. The disclosed designs and methods are useful in the manufacture of SJ devices, such as metal-oxide-semiconductor field-effect transistors (MOSFETs), junction field effect transistors (JFETs), bipolar junction transistors (BJTs), diodes, as well as other SJ devices that may be useful for medium-voltage (e.g., 2 kV-10 kV) and high-voltage (e.g., greater than or equal to 10 kV or 10 kV-20 kV) power conversion related applications. Further, the disclosed designs and methods are useful in the manufacture of wide band gap SJ devices, such as silicon carbide (SiC) SJ devices, gallium nitride SJ devices, diamond SJ devices, aluminum nitride SJ devices, boron nitride SJ devices, as well as other SJ devices manufactured using one or more wide band gap semiconductor materials.

As discussed below, the disclosed SJ devices include multi-layered drift regions implemented using repeated epitaxial growth and dopant implantation steps. As used herein, the term "multi-layered," as well as references to a particular number of layers (e.g., "two-layered," "three-layered," "four-layered,"), refers to the number of epitaxial (epi) layers of the SJ device. The disclosed SJ multi-layered drift region designs include charge balance (CB) layers having a first conductivity type (e.g., n-type CB layers). Further, each of these CB layers includes a plurality of charge balance (CB) regions, which are discrete, buried, implanted regions of doping having the opposite conductivity type as the remainder of the CB layer that reshape the electrical field in the active area of a SJ device. These CB regions are described herein as "buried" in that they are disposed within the lower epi layers (e.g., within a CB layer that is disposed between the upper/device epi layer and the substrate layer) of the SJ device and are not in contact with a device terminal. For the disclosed SJ device embodiments, as discussed below, these CB layer designs enable low conduction losses and high blocking voltages while still maintaining a relatively simple fabrication process.

Further, as discussed below, the disclosed SJ devices include connection regions of the same conductivity type as the CB regions, and the connection regions generally provide a connection (e.g., a vertical connection, a horizontal connection, or a combination thereof) between the CB regions of the CB layers and a highly doped region (e.g., a top region, a second conductivity region, a well region, body contact region, a junction barrier region, a body region, or termination region) of the same conductivity type as the CB regions that is disposed on or proximate to a top surface (e.g., farthest from the substrate layer) of the SJ device. As such, when the SJ device transitions from an off-state to on-state, carriers are able to flow directly from the highly doped region to the CB regions via the connection regions. Conversely, during a transition from on-state to off-state, carriers are able to flow directly from the CB regions to the highly doped region via the connection regions. As a result, the switching performance of disclosed SJ devices is independent of the recombination-generation rates of the carriers, thereby offering increased switching speeds and reduced switching and dynamic on-resistance losses compared to SJ devices with floating CB regions having the same current/voltage rating, without substantially increasing the leakage current. While the following discussion relates to MOSFETs, the disclosed designs and methods may also be applied to junction field effect transistors (JFETs), bipolar junction transistors (BJTs), diodes (e.g., junction barrier Schottky (JBS) diodes, merged PiN Schottky (MPS) diodes, etc.), as well as other SJ devices that may be useful for medium-voltage (e.g., 2 kV-10 kV) and high-voltage (e.g., greater than or equal to 10 kV or 10 kV-20 kV) power conversion related applications.

FIG. 1 is a perspective view of an embodiment of a super junction (SJ) MOSFET device 8 having a drift region 12 that includes a device layer 14 disposed on a number of charge balance (CB) layers 16. It may be appreciated that, in order to more clearly illustrate certain components of the SJ MOSFET device 8, as well as other devices discussed below, certain commonly understood design elements (e.g., top metallization, passivation, edge termination, and so forth) may be omitted.

As discussed below, the drift region 12 of the SJ MOSFET device 8 illustrated in FIG. 1 includes a number of epitaxial layers 18 having a first conductivity type (e.g., n-type epi layers 18) that form the device layer 14 and the CB layers 16 of the SJ MOSFET device 8. Additionally, the epi layers 18 each have a dopant concentration, which may be the same or different, in certain embodiments. While the illustrated embodiment includes three epi layers 18 (e.g., 18A, 18B, and 18C), the SJ MOSFET device 8 may include any suitable number of epi layers 18 (e.g., 2, 4, 5, 6, or more) to yield a SJ MOSFET device 8 having a particular desired voltage rating. In some embodiments, the epi layers 18 may be formed from one or more wide band gap semiconductor materials, such as silicon carbide, gallium nitride, diamond, aluminum nitride, and/or boron nitride. The epi layers 18 may be fabricated using repeated cycles of epitaxial overgrowth. As illustrated, the first epi layer 18A is disposed above and adjacent to a substrate layer 30, the second epi layer 18B is disposed above and adjacent to the first epi layer 18A, and the third epi layer 18C is disposed above and adjacent to the epi layer 18B.

A top surface 10 of the device layer 14 of the illustrated SJ MOSFET device 8 includes a well region 20 having a second conductivity type (e.g., a p-well region 20) and disposed adjacent to a source region 22 having the first conductivity type (e.g., n-type source region 22). A dielectric layer 24 (also referred to as a gate insulating layer or gate dielectric layer) is disposed adjacent to the device layer 14, and a gate electrode 26 is disposed adjacent to the dielectric layer 24. Further, the plurality of CB layers 18 is disposed on a substrate layer 30 (e.g., a semiconductor substrate layer, a wide band gap substrate layer), and a drain contact 32 is disposed on the bottom 11 of the SJ MOSFET device 8, adjacent to the substrate layer 30.

Additionally, as illustrated in FIG. 1, a source contact 28 is disposed adjacent to the top surface 10 of the device layer 14, and is disposed on a portion of both the source region 22 and the well region 20 of the device layer 14. For clarity, the portion of the source region 22 (e.g., n-type source region 22) of the SJ MOSFET device 8 disposed below the source contact 28 may be more specifically referred to herein as a source contact region 34 of the SJ MOSFET device 8. Similarly, a portion of the well region 20 (e.g., p-type well region) of the SJ MOSFET device 8 may be more specifically referred to herein as a body region 36 (e.g., p+ body region 36) of the SJ MOSFET device 8. Additionally, the portion of the body region 36 that is disposed below and adjacent to (e.g., covered by, directly electrically connected to) the source contact 28, may be more specifically referred to herein as a body contact region 38 (e.g., p+ body contact region 38) of the SJ MOSFET device 8.

During on-state operation, an appropriate gate voltage (e.g., at or above a threshold voltage ($V_{TH}$) of the SJ MOSFET device 8) may cause an inversion layer to be formed in a channel region 40, as well as a conductive path to be enhanced in a junction field-effect transistor (JFET) region 42 due to accumulation of carriers, allowing current to flow from the drain contact 32 (e.g., drain electrode, drain terminal) to the source contact 28 (e.g., source electrode, source terminal). The channel region 34 may be generally defined as an upper portion of the well region 20 disposed below the gate electrode 26 and the dielectric layer 24.

To reduce on-state resistance (Rds(on)) and resultant on-state conduction losses, the SJ MOSFET device 8 includes two CB layers 16A and 16B that each include a plurality of CB regions 46. The plurality of CB regions 46 may include any of the features described in co-pending U.S. application Ser. No. 14/752,446, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes. It may be appreciated that, in other embodiments, the device layer 14 may include other implanted features (e.g., features particular to other device structures/types) without spoiling the effect of the present approach.

The CB regions 46 are oppositely doped relative to the remainder 48 of the CB layers 16A and 16B. In other words, for SJ devices 10 having n-type CB layers 16 (e.g., n-type SiC epitaxial layers 18), the CB regions 46 are p-type, and for SJ devices 10 having p-type epi layers 18, the CB regions 46 are n-type. Further, the dopant concentration in the CB regions 46 of the CB layer 16A and in the CB regions 46 of the CB layer 16B may be the same or different, in certain embodiments. The CB regions 46 and the remainder 48 of the CB layers 16A and 16B are each generally designed to substantially deplete and to generally provide similar amounts (e.g., substantially equal amounts) of effective charge (e.g., per cm$^2$, normalized to device active area) from ionized dopants under reverse bias. The illustrated charge balance structure allows the SJ MOSFET device 8 to achieve high breakdown voltage and low on-state resistance, since the p-type semiconductor portions and the n-type semiconductor portions are both completely depleted under nominal blocking conditions.

Figure 2:
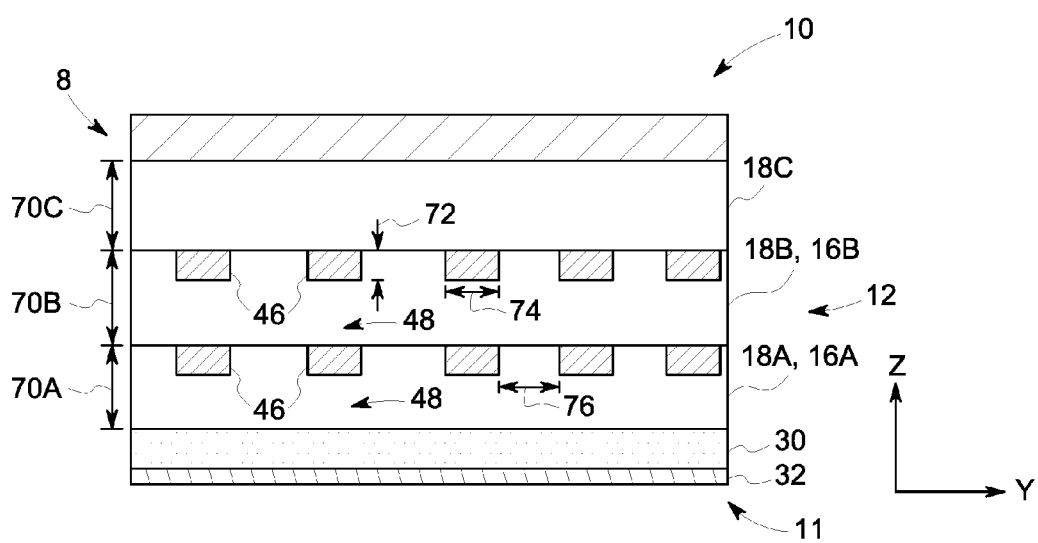
FIG. 2 illustrates a cross-sectional view of the drift region of the SJ MOSFET device of FIG. 1, in accordance with an embodiment.

As illustrated, the CB regions 46 of the SJ MOSFET device 8 are separated by (e.g., not vertically connected through) and do not extend through the entire thicknesses of the epi layers 18C and 18B. For example, FIG. 2, which is a cross-sectional view of the embodiment of the SJ MOSFET device 8 illustrated in FIG. 1, illustrates the dimensions of the epi layers 18A-C and the CB regions 46. In particular, the epi layers 18A, 18B, and 18C have thicknesses 70A, 70B, and 70C, respectively, that may be the same or different, in certain embodiments. Additionally, the CB regions 46 in the CB layers 16A and 16B of the illustrated SJ MOSFET device 8 have a particular thickness 72. It should be appreciated that, in some embodiments, the thickness 72 of the CB regions 46 may be different in different CB layers 16. The thickness 72 of the CB regions 46 is less than the thicknesses 70A and 70B of the CB layers 16A and 16B, respectively, and as such, the CB regions 46 are not vertically connected through (i.e., do not extend through the entire thicknesses 70A and 70B) of the epi layers 18A and 18B. It may be appreciated that this feature is in contrast to other SJ device designs in which the charge-balance regions are continuous (e.g., continuous vertical pillars that extend through the entire thicknesses of the epi layers 18A and 18B). SJ devices including continuous, vertical charge balance pillars are capable of providing low conduction losses and high blocking voltages. However, fabricating continuous, vertical charge balance pillars that extend through the thicknesses 70A and 70B of the epi layers 18A and 18B may be challenging for certain semiconductor materials having low diffusion coefficients of dopants. For example, fabricating such charge balance pillars may be challenging for embodiments in which the epi layers 18A and 18B are fabricated from SiC, which has low diffusion coefficients of dopants compared to silicon (Si).

For example, in order to form charge balance pillars that extend through the entire thickness of the drift region, as present in a full charge-balance device, numerous (e.g., 10+) thin epitaxial growth/shallow ion implantation steps may be performed. Alternatively, high energy implantation may be used along with high stopping power masking (e.g., silicon on insulator (SOI), polysilicon, thick silicon oxide, high-Z metals such as platinum, molybdenum, gold), which are not common for current high-volume Si/SiC manufacturing processes. In contrast, the CB regions 46 of the SJ MOSFET device 8 are amenable to existing and maturing Si/SiC fabrication techniques and infrastructure. In particular, to manufacture the SJ MOSFET device 8, two or more epitaxial growth steps and one or more ion implantation steps may be performed. For example, present (high volume) ion implantation tooling limits implant acceleration energies to much less than 1 MeV (e.g., approximately 380 keV). At these energies, the projected range (e.g., the penetration depth) of most commonly used SiC dopants (e.g., nitrogen, phosphorus, aluminum) is approximately 1 μm or less, which is suitable for implantation of the CB regions 46, as discussed below.

For example, to manufacture the illustrated SJ MOSFET device 8, the first epi layer 18A may be formed on top of the substrate layer 30 using epitaxial growth techniques (e.g., epitaxial SiC grown techniques), and the CB regions 46 may be formed in the first epi layer 18A using ion implantation to yield a first CB layer 16A. Further, the second epi layer 18B may be formed on top of the first epi layer 18A using epitaxial growth techniques, and the CB regions 46 may be formed in the second epi layer 18B using ion implantation to yield a second CB layer 16B. It should be noted that the epitaxial growth/ion implantation steps may be repeated multiple (e.g., 2, 3, 4, 5, or more) times to yield a SJ MOSFET device 8 with any suitable number of CB layers 16. Additionally, the final epi layer 18C may be formed on top of the second epi layer 18B using epitaxial growth techniques and may be suitably implanted with particular features to form the device layer 14 of the SJ MOSFET device 8.

Additionally, with respect to dimensions, each CB region 46 may have a particular width 74 and a particular spacing 76. In certain embodiments, the dimensions (e.g., thickness 72, width 74, and/or spacing 76) of the CB regions 46 may be different in different CB layers 16. In different embodiments, the CB regions 46 may have different cross-sectional shapes (e.g., defined by implantation energies/doses). For some embodiments, the shape of the CB regions 46 may not substantially vary along the Z-axis.

Further, it should be appreciated that the doping of the epi layers 18, the doping of the CB regions 46, the thicknesses 70 of the epi layers 18, the thickness 72 of the CB regions 46, the width 74 of the CB regions 46, and the spacing 76 between the CB regions 46 may be varied for different embodiments to enable desired electrical performance (e.g., desired blocking voltage) of the SJ MOSFET device 8. The disclosed SJ MOSFET device 8 may incorporate different values of the doping of the epi layers 18, the doping of the CB regions 46, the thicknesses 70 of the epi layers 18, the thickness 72 of the CB regions 46, the width 74 of the CB regions 46, and the spacing 76 between the CB regions 46 as discussed in co-pending U.S. application Ser. No. 14/752,446, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes, to achieve a desired blocking voltage of the SJ MOSFET device 8 and a desired reduction in specific on-resistance of the drift region 12.

For example, in some embodiments, certain cell parameters (e.g., the thickness 70 and doping of the epi layers 18) may be selected to provide a blocking voltage of the SJ MOSFET device 8 that is between approximately 1 kilovolt (kV) and 10 kV, 1 kV and 5 kV, or any other suitable range. In certain embodiments, the specific on-resistance of the drift region 12 of the SJ MOSFET device 8 may between approximately 40% and 50% less than the specific on-resistance of a drift region of a non-SJ device (e.g., a semiconductor power device without the CB regions 46). Further, in some embodiments, the dopant concentration of the CB regions 46 and/or the epi layers 18 may be between approximately $5 \times 10^{12}$ cm$^{-3}$ and approximately $5 \times 10^{18}$ cm$^{-3}$, approximately $2 \times 10^{16}$ cm$^{-3}$ and approximately $1 \times 10^{18}$ cm$^{-3}$, or approximately $5 \times 10^{16}$ cm$^{-3}$ and approximately $5 \times 10^{17}$ cm$^{-3}$. Further, in some embodiments, the effective sheet dopant concentration of the CB regions 46, which may be calculated by normalizing the doping concentration of the CB regions 46 to the unit cell area of the SJ MOSFET device 8, may be less than or equal to approximately $1.1 \times 10^{13}$ cm$^{-2}$. Additionally, in some embodiments, the spacing 76 between the CB regions 46 may be between approximately 0.25 micrometers (μm) and approximately 10 μm, approximately 0.5 μm and approximately 8 μm, approximately 0.75 μm and approximately 6 μm, or approximately 1 μm and approximately 3 μm.

As noted above, the SJ MOSFET device 8 may also include features to decrease switching losses and increase switching speed. For example, the embodiment of the SJ device 80 (e.g., a SJ MOSFET device) illustrated in FIG. 3 includes a connection region 100 having the same conductivity type as the CB regions 46 (opposite conductivity type as the epi layers 18) that is implanted into each of the epi layers 18. In certain embodiments, the SJ device 80 may include any suitable number of connection regions 100 in the form of continuous, vertical pillars or continuous, vertical blocks) that are implanted into portions of the epi layers 18A-C. In particular, the disclosed connection regions 100 are disposed adjacent to one or more highly doped regions 102 (e.g., top regions, second conductivity regions, well regions 20, body regions 36, body contact regions 38, or junction barrier regions) of the same conductivity type as the connection region 100 and the CB regions 46. The one or more highly doped regions 102 may be disposed adjacent to (e.g., disposed on, disposed in, implanted in, etc.) the top surface 10 of the device layer 14 of the SJ device 80 (e.g., a well region 20, a body region 36, a body contact region 38, a junction barrier region). Additionally, the disclosed connection regions 100 may connect at least one highly doped region 102 disposed in the device layer 14 to at least one of the plurality of CB regions 46 of the CB layers 16. In particular, the disclosed connection regions 100 may extend vertically from one or more highly doped regions 102 (e.g., from one or more features near the top surface 10 of the device layer 14) to at least one CB region 46 of the CB layers 16. For example, the connection regions 100 may adjoin the highly doped regions 102 and at least one CB region 46. In some embodiments, the connection regions 100 may overlap with the highly doped regions 102 and at least one CB region 46.

In some embodiments, the one or more connection regions 100 may have a depth 104 (e.g., vertical dimension, thickness) to reach the deepest CB regions 46 (i.e., the CB regions 46 that are nearest the substrate 30 and farthest from the device layer 14). Further, the depth 104 of the one or more connection regions 100 may be such that the connection regions 100 extend to and contact (e.g., are disposed adjacent to) the deepest CB regions 46, extend through (e.g., overlap with) a portion of the thicknesses 72 of the deepest CB regions 46, or extend through (e.g., overlap with) the entire thicknesses 72 of the deepest CB regions 46. For example, the depth 104 may be greater than or equal to the sum of the thicknesses 70 of n−1 epi layers 18, where n is the total number of epi layers 18 in a SJ device 80.

Figure 3:
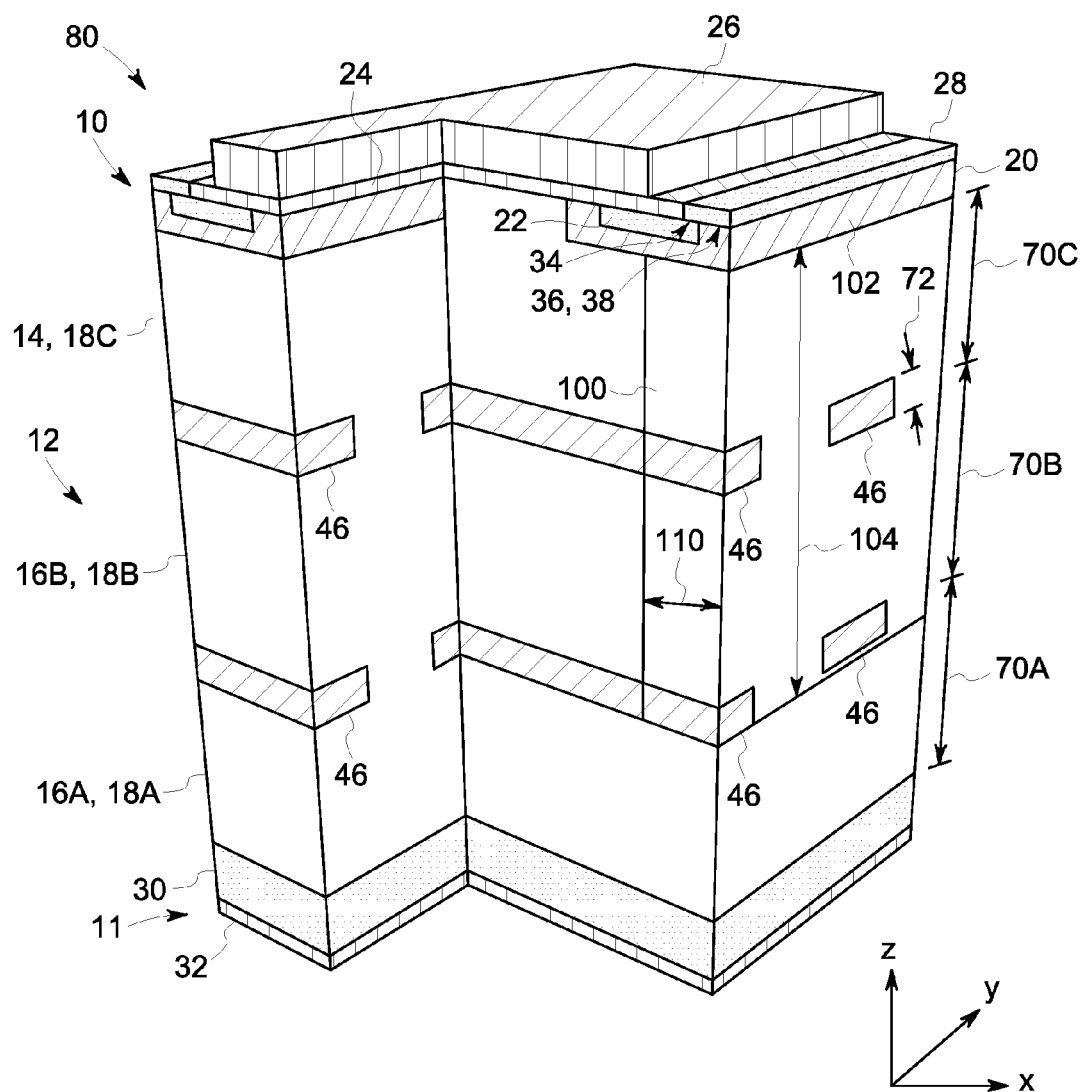
FIG. 3 illustrates a perspective view of a SJ MOSFET device that includes a connection region that adjoins the CB regions of the CB layers to a well region of the SJ device, in accordance with an embodiment.

For example, in the embodiment illustrated in FIG. 3, the depth 104 of the connection region 100 is greater than the sum of the thicknesses 70B and 70C of the CB layers 16A and 16B (i.e., the lower two epi layers 18A and 18B). In particular, in the illustrated embodiment, the connection region 100 extends from (e.g., is disposed adjacent to and contacts) the highly doped region 102, which in this case is the well region 20. The connection region 100 extends through the third epi layer 18C (i.e., through the thickness 70C of the third epi layer 18C), through the second epi layer 18B (i.e., through the thickness 70B of the second epi layer 18B and the thickness 72 of the CB regions 46 in the second CB layer 16B), and through a portion of the thickness 70C of the first epi layer 18A (i.e., through the thickness 72 of the CB regions 46 in the first CB layer 16A). However, it should be appreciated that in other embodiments, the depth 104 may be such that the connection region 100 only extends through the thicknesses 70B and 70C of the second and third epi layers 18B and 18C, respectively (i.e., the connection region 100 does not extend through the CB regions 46 in the bottom CB layer 16A), or such that the connection region 100 extends through only a portion of thickness 72 of the CB regions 46 in the bottom CB layer 16A.

The one or more connection regions 100 may be fabricated by introducing dopants (e.g., boron, aluminum, nitrogen, phosphorus) into the epi layers 18 of the SJ device 80 using high energy ion implantation. In some embodiments, dopants may be injected with implant acceleration energies between approximately 500 keV and approximately 20 MeV to achieve the desired depth 104. Additionally, in certain embodiments, the one or more connection regions 100 may formed using high energy ion implantation along with high stopping power or high blocking mask (e.g., silicon on insulator (SOI), polysilicon, thick silicon oxide, high-Z metals such as platinum, molybdenum, gold). In particular, the high stopping power mask may be placed on the top surface 10 of the top epi layer 18C after epitaxial growth, and the high stopping power mask may have openings for one or more connection regions 100 while covering the remainder of the top surface 10 of the top epi layer 18C. Additionally, the one or more connection regions 100 may be formed before or after the highly doped regions 102 (e.g., the well region 20) in different embodiments. In some embodiments, the one or more connection regions 100 may be at least partially implanted between the epi growth steps (e.g., implanted before or after the CB regions 46 are formed in the epi layer 18B and before the epi growth of the next epi layer 18C) such that a lower energy implant may be used to achieve a suitable depth 104.

The one or more connection regions 100, which connect the CB regions 46 to the one or more highly doped regions 102, in this case the well region 20, generally decrease switching losses and increase switching speed of the SJ device 80. In particular, carriers from the well region 20 may flow directly to the CB regions 46 via the one or more connection regions 100 during transition of the SJ device 80 from off-state (e.g., blocking state) to on-state (e.g., conducting state), and similarly, carriers from the CB regions 46 may flow directly to the well region 20 via the one or more connection regions 100 during transition of the SJ device 80 from on-state to off-state. As such, the one or more connection regions 100 may increase the recombination-generation rates of the carriers, thereby decreasing switching losses and increasing switching speeds. Further, in contrast to other techniques for increasing recombination-generation rates of the carriers, such as introducing point defects/recombination centers into the epi layers 18 using in-situ doping, neutron irradiation, and so forth, the one or more connection regions 100 may decrease switching losses and increase switching speeds of the SJ device 80 without substantially increasing the leakage current of the SJ device 80.

In some embodiments, the switching speed of the SJ device 80 having the one or more connection regions 100 may be between approximately 10 and approximately 2000, approximately 25 and approximately 1000, approximately 50 and approximately 750, approximately 75 and approximately 500, or approximately 100 and approximately 250 times greater than the switching speed of SJ devices without the one or more connection regions 100. In certain embodiments, the switching speed of the SJ device 80 including the one or more connection regions 100 may at least 1 kilohertz (kHz). In some embodiments, the switching speed of the SJ MOSFET device 8 may be between approximately 75 kHz and approximately 150 kHz, approximately 85 kHz and approximately 125 kHz, or approximately 95 kHz and approximately 105 kHz. SJ devices utilizing floating CB regions without the disclosed connection regions 100 may have switching speeds less than approximately 1 kHz, less than approximately 750 Hz, less than approximately 500 Hz, or less than approximately 250 Hz. Accordingly, the disclosed SJ device 80 having the one or more connection regions 100 may have significantly faster switching speeds than SJ devices utilizing floating CB regions without the disclosed connection regions 100.

As noted above, the one or more highly doped regions 102 (e.g., the top regions) may be disposed adjacent to the top surface 10 of the device layer 14. In some embodiments, the one or more highly doped regions 102 may be or may include the well region 20 (e.g., the p-type well region 20). In certain embodiments, the one or more highly doped regions 102 may be or may include the body region 36 (e.g., the p+ body region 36) the body contact region 38 (e.g., the p+ body contact region 38), and/or a junction barrier region (e.g., a junction barrier region of a junction barrier Schottky (JBS) or a merged PiN Schottky (MPS) diode). That is, the one or more connection regions 100 may be disposed adjacent to and/or may extend through (e.g., overlap with) at least a portion of the well region 20, the body region 36, and/or the body contact region 38. In some embodiments, the one or more highly doped regions 102 may have a dopant concentration between approximately $2\times10^{16}$ cm$^{-3}$ and approximately $5\times10^{20}$ cm$^{-3}$, approximately $5\times10^{16}$ cm$^{-3}$ and approximately $1\times10^{19}$ cm$^{-3}$, or approximately $1\times10^{17}$ cm$^{-3}$ and approximately $5\times10^{18}$ cm$^{-3}$. In some embodiments, the highly doped regions 102 may generally have a doping concentration that is at least 50% greater (e.g., between approximately 50% and 200%, or more) than the doping concentration in the CB regions 46 and/or the connection regions 100. In certain embodiments, the highly doped regions 102 may generally have a doping concentration that is at least $1\times10^{13}$ cm$^{-2}$/thickness of the region (e.g., the CB regions 46 and/or the connection regions 100). In some embodiments, the highly doped regions 102 may generally have a doping concentration that is between approximately 1 order of magnitude and 6 orders of magnitude greater than the doping concentration in the CB regions 46 and/or the connection regions 100.

As illustrated, the connection region 100 also includes a width 110. The width 110 and the dopant concentration of the connection region 100 may be selected to maintain charge balance within the CB layers 16 (e.g., the lower epi layers 18A and 18B) having the CB regions 46, as well as to enable desirable electrical performance of the SJ device 80 (e.g., a desired blocking voltage). For example, in some embodiments, the width 110 may be between approximately 1 μm and approximately 3 μm. Further, the dopant concentration of the connection region 100 may be between approximately $1\times10^{16}$ cm$^{-3}$ and approximately $1\times10^{17}$ cm$^{-3}$, approximately $1\times10^{16}$ cm$^{-3}$ and approximately $4\times10^{16}$ cm$^{-3}$, or approximately $4\times10^{16}$ cm$^{-3}$ and approximately $1\times10^{17}$ cm$^{-3}$. In some embodiments, the dopant concentration of the connection region 100 may be equal to or less than the dopant concentration of the CB regions 46.

In some embodiments, the CB regions 46 may entirely or partially overlap with the connection region 100. For example, as illustrated, the CB regions 46 may entirely overlap with the connection region 100 such that the CB regions 46 extend through the width 110 of the connection region 100. In some embodiments, as illustrated by the embodiment of the SJ device 120 in FIG. 4, the CB regions 46 may only extend partially through the width 110 of the connection region 100. For example, the CB regions 46 may overlap with the connection region 100 by a distance 140 that is less than the width 110 of the connection region 100. In some embodiments, the distance 140 may be greater than or equal to 0.1 μm. In certain embodiments, the distance 140 may be less than half of the width 110.

Figure 4:
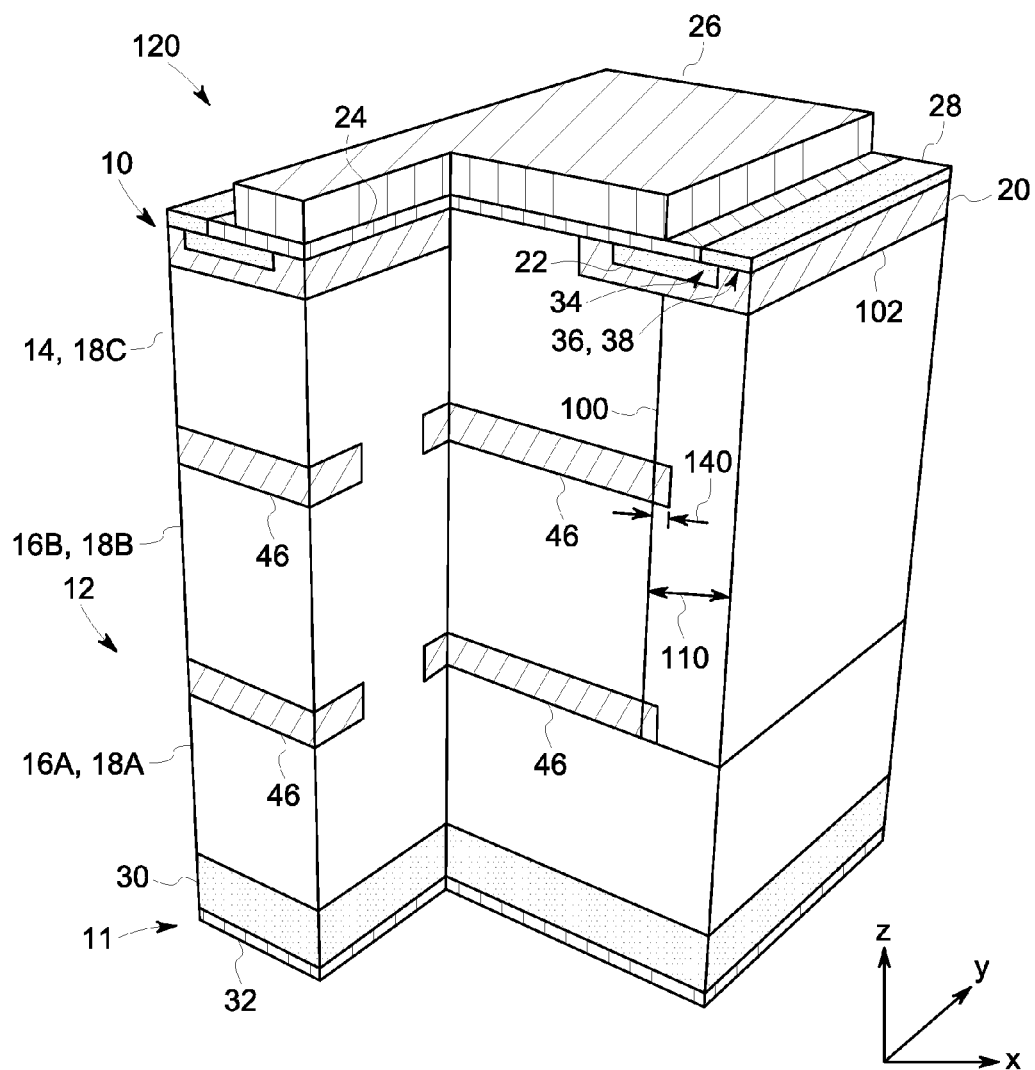
FIG. 4 illustrates a perspective view of a SJ MOSFET device that includes a connection region that adjoins the CB regions of the CB layers to a well region of the SJ device, in accordance with an embodiment.
Figure 5:
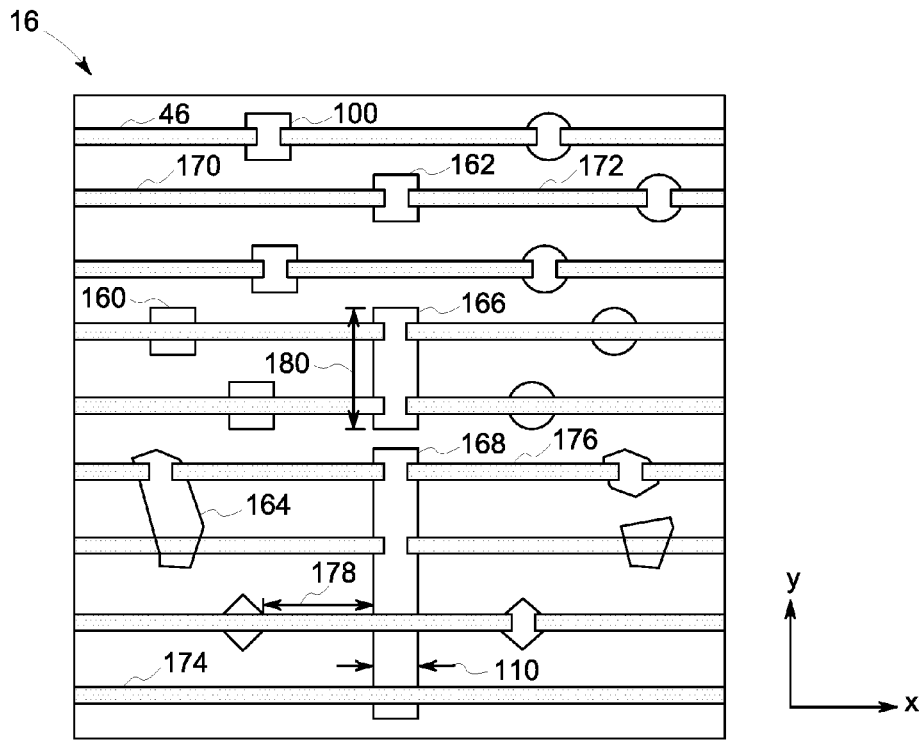
FIG. 5 is a top down view of a CB layer that includes CB regions and connection regions, in accordance with an embodiment.

Although the embodiments of the SJ devices 80 and 120 illustrated in FIGS. 3 and 4, respectively, include one connection region 100, it should be noted that the SJ devices 80 and 120 may include any suitable number of connection regions 100. In some embodiments, the SJ device 80 or 120 may include 2, 3, 4, 5, 6, 7, 8, 9, 10, or more connection regions 100. For example, FIG. 5 illustrates a top down view of a CB layer 16 including a plurality of CB regions 46 and a different types of connection regions 100. In some embodiments, the CB layer 16 may include a first connection region 160 that connects to only one CB region 46 per layer, a second connection region 162 that connects to two CB regions 46, and/or a third connection region 164 that connects to three CB regions 46. In certain embodiments, the CB layer 16 may include a fourth connection region 166 that connects to four CB regions 46, and a fifth connection region 168 that connects to six CB regions 46. It should be noted that each connection region 100 may connect to any number of CB regions 46 (e.g., 1, 2, 3, 4, 5, 6, 7, 8, 9, 10, or more). Further, each CB region 46 may connect to one or more connection regions 100 in different embodiments. For example, the CB layer 16 may include a first CB region 170 that connects to only one connection region 100 and a second CB region 172 that connects to two connection regions 100. Further, the connection regions 100 may be connected to the same or different highly doped regions 102 (e.g., the same or different well region 20, the same or different body region 36, the same or different body contact region 38, etc.). Further, as illustrated, the CB layer 16 may include continuous (e.g., horizontally continuous, continuous along x-axis) CB regions 174 and/or discontinuous (e.g., horizontally discontinuous, discontinuous along x-axis) CB regions 176.

Additionally, the connection regions 100 may be any suitable shape. For example, the cross-section of the connection regions 100 may be rectangular, square, circular, oval, triangular, irregular, etc. Additionally, the shape and/or cross-sectional dimensions of the connection regions 100 may be substantially constant or may vary along its respective depth 104 (e.g., along the z-axis). Further, in embodiments, in which more than one connection region 100 is used, the connection regions 100 may be spaced apart by a distance (e.g., spacing) 174. In some embodiments, the distance 178 may be equal to or greater than 5, 6, 7, 8, 9, or 10 times the width 110. In some embodiments, the distance 178 may be equal to or greater than 10 μm, 30 μm, or 100 μm.

It should be appreciated that the doping of the connection regions 100, the dimensions (e.g., depth 104, width 110, and/or length 180) of the connection regions 100, and the distance 178 between each connection region 100 may be varied for different embodiments, in addition to the parameters of the epi layers 18 and the CB regions 46 discussed above, to enable desired electrical performance (e.g., desired blocking voltage, conduction losses, switching speeds, etc.) of the SJ device. In some embodiments, the dimensions (e.g., width 110 and length 176) of each connection region 100 may be small to minimize conduction losses. As noted above, the width 110 may be between approximately 1 μm and 3 μm. Further, in certain embodiments, the length 180 may be between approximately 1 μm and 10 μm, 1 μm and 6 μm, or 1 μm and 3 μm. Still further, it should be appreciated that the dimensions (e.g., depth 104, width 110, and length 180) of each connection regions 100 may be the same or different, and the distance 178 between each connection region 100 may be the same or different. In embodiments in which the widths 110 of two connection regions 100 (e.g., two neighboring connection regions 100) are different, the distance 178 between the two connection regions 100 may be equal to or greater than 5 times the smaller width 110 of the two connection regions 100.

Figure 6:
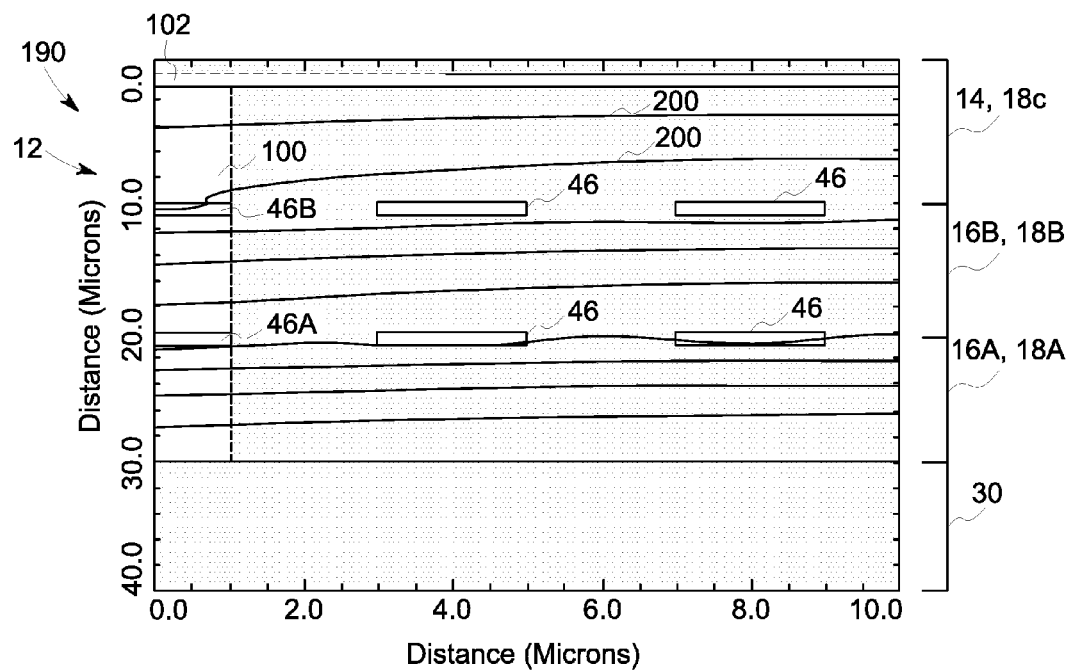
FIG. 6 is a cross-sectional view of a drift region of a SJ device including a connection region that adjoins the CB regions of the CB layers to a top region of the SJ device, wherein the equipotential lines demonstrate the electric field present under reverse bias conditions, in accordance with an embodiment.

FIG. 6 illustrates a cross-sectional view of the drift region 12 of an embodiment of a SJ device 190 that includes the CB regions 46 and the connection region 100. In particular, in the illustrated embodiment, the multi-layer drift region 12 includes the three epi layers 18A, 18B, and 18C, and the CB regions 46 are formed in the lower epi layers 18A and 18B (i.e., CB layers 16A and 16B). Further, in the illustrated embodiment, the connection region 100 connects two particular CB regions, 46A and 46B, with the highly doped region 102. Additionally, FIG. 6 includes equal potential lines 200 that indicate the electric field present in the drift region 12 of the SJ device 190 under reverse bias conditions. The strength of the electric field is represented as being stronger when the lines are close to one another and weaker when there is larger spacing between the equal potential lines 200. As seen in FIG. 6, for the illustrated embodiment, the spacing between the equal potential lines 200 does not substantially change with increasing distance from the connection region 100. As such, the connection region 100 and does not substantially change or alter the strength of the electric field in the drift region 12. Thus, the connection region 100 may increase the switching speed of the SJ device 190 by providing carriers from the highly doped region 102 to the CB regions 46 without substantially changing the electric field distribution and without resultantly decreasing the blocking voltage of the SJ device 190.

Figure 7:
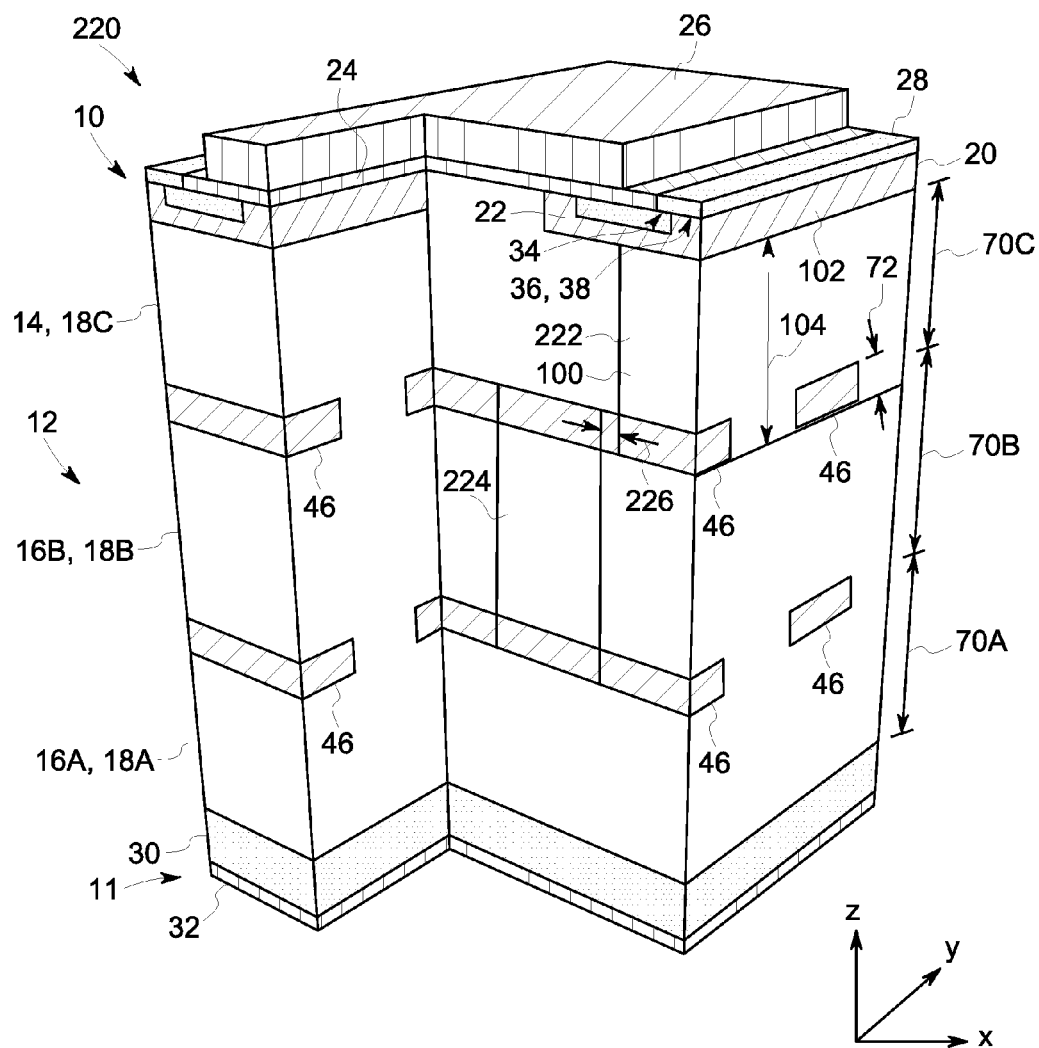
FIG. 7 is a perspective view of a SJ device that includes a segmented connection region that adjoins the CB regions of the CB layers to a top region of the SJ device, in accordance with an embodiment.
Figure 8:
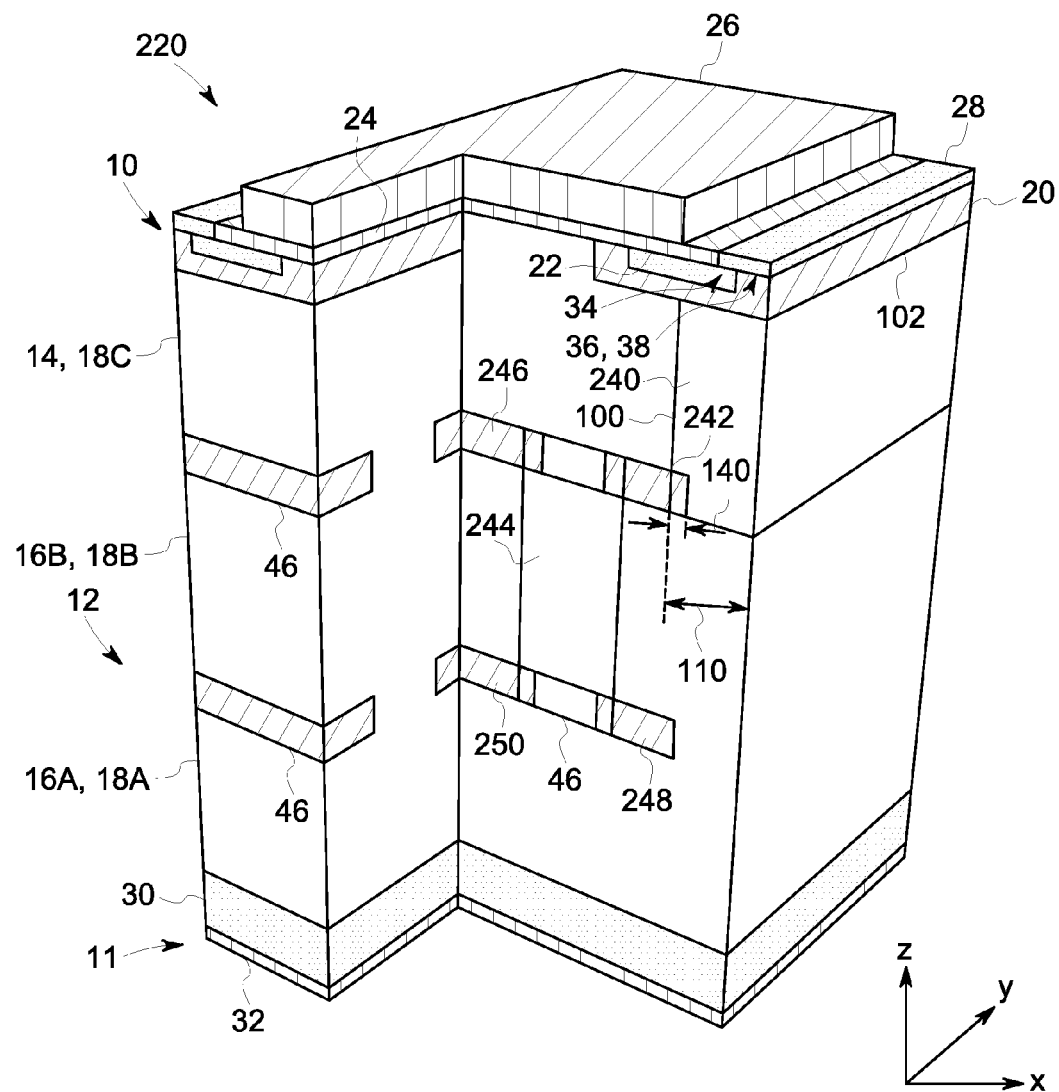
FIG. 8 is a perspective view of a SJ device that includes a segmented connection region that adjoins the CB regions of the CB layers to a top region of the SJ device, in accordance with an embodiment.

FIG. 7 illustrates an embodiment of a SJ device 220 including a segmented connection region 100. As illustrated, the connection region 100 may include a first connection segment 222 that extends from the highly doped region 102 to a CB region 46 in the second CB layer 16B. Additionally, the connection region 100 may include a second connection segment 224 that extends from the CB region 46 in the second CB layer 16B to a CB region 46 in the first CB layer 16A. As illustrated, the first connection segment 222 and the second connection segment 224 are not adjoined (e.g., are staggered, are not vertically aligned). In particular, the second connection segment 224 is spaced apart from the first connection segment 222 by a distance 226. It should be noted that the connection region 100 may include any suitable number of connection segments, such as two, three, four, five, or more, and the connection segments may be adjoined or not adjoined in different CB layers 16. Further, in some embodiments, the connection region 100 may include connection segments that extend through multiple CB regions 46 in the same CB layer 16. For example, as illustrated in FIG. 8, the connection region 100 may include a first connection segment 240 that extends from the highly doped region 102 to a first CB region 242 in the second CB layer 16B. Additionally, the connection region 100 may include a second connection segment 244 that extends from the first CB region 242 in the second CB layer 16B and from a second CB region 246 in the second CB layer 16B to third and fourth CB regions 248 and 250, respectively, in the first CB layer 16A. Further, as illustrated, the first connection segment 240 and the second connection segment 244 may not be adjoined in some embodiments. In certain embodiments, the first connection segment 240 and the second connection segment 244 may be adjoined (e.g., may at least partially overlap with one another).

Technical effects of the invention include SJ device designs that reduce switching losses and increase switching speed of SJ devices, without substantially increasing leakage current or diminishing blocking voltage of the SJ devices. In particular, the disclosed SJ devices include CB layers that reshape the electrical field in the active area of a SJ device to enable low conduction losses and high blocking voltages while still maintaining a relatively simple fabrication process. Additionally, the disclosed SJ devices include one or more connection regions that connect the CB regions of the CB layers to a highly doped region (e.g., a well region, a p+ region). As a result, the disclosed SJ devices enable increased switching speeds and reduced switching losses compared to existing SJ devices having the same current/voltage rating without substantially increasing the leakage current.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A super junction (SJ) device, comprising:
   a device layer having a first conductivity type, wherein the device layer comprises a top region having a second conductivity type disposed in a top surface of the device layer;
   a first charge balance (CB) layer having the first conductivity type disposed adjacent to the device layer, wherein the first CB layer comprises a first plurality of charge balance (CB) regions having the second conductivity type;
   a first connection region having the second conductivity type disposed in the device layer and the first CB layer, wherein the first connection region extends from the top region of the device layer to at least a first CB region of the first plurality of CB regions of the first CB layer, wherein the first connection region extends through a thickness of the first CB region of the first plurality of CB regions;
   a second connection region having the second conductivity type disposed in the device layer and the first CB layer, wherein the second connection region extends from the top region of the device layer to at least a second CB region of the first plurality of CB regions; and
   a second charge balance (CB) layer having the first conductivity type disposed adjacent to the first CB layer, wherein the second CB layer comprises a second plurality of charge balance (CB) regions having the second conductivity type, wherein the first connection region extends from the top region of the device layer to at least one of the second plurality of CB regions of the second CB layer, wherein a remainder of the first plurality of CB regions and a remainder of the second plurality of CB regions are not connected by the first connection region, wherein the first plurality of CB regions are discrete from the second plurality of CB regions and spaced from each other by less than a thickness of the first CB layer.

2. The SJ device of claim 1, wherein a width of the first connection region is between approximately 1 μm and 5 μm.

3. The SJ device of claim 2, wherein a doping concentration of the first connection region is between approximately $5 \times 10^{15}$ cm$^{-3}$ and approximately $4 \times 10^{16}$ cm$^{-3}$.

4. The SJ device of claim 1, wherein the first connection region overlaps with the first CB region by a distance that is less than a width of the first connection region.

5. The SJ device of claim 1, wherein a spacing between the first and second connection regions is greater than or equal to 5 times of a width of the first connection region or the second connection region.

6. The SJ device of claim 5, wherein a doping concentration of the first and second connection regions is between approximately $4 \times 10^{16}$ cm$^{-3}$ and approximately $1 \times 10^{17}$ cm$^{-3}$.

7. The SJ device of claim 1, wherein the device layer and the CB layer are fabricated from a wide band gap semiconductor material.

8. The SJ device of claim 7, wherein the device layer and the CB layer are fabricated from silicon carbide (SiC).

9. The SJ device of claim 1, wherein the SJ device is a metal-oxide-semiconductor field-effect transistor (MOSFET), a junction field effect transistors (JFET), a bipolar junction transistors (BJT), or a diode.

10. The SJ device of claim 1, wherein the first connection region comprises a first connection segment that extends from the top region of the device layer to the first CB region of the first CB layer, wherein the first connection region comprise a second connection segment that extends from the first region to a second CB region of the second plurality of CB regions of the second CB layer, and wherein the first connections segment and the second connection segment are not adjoined.

11. The SJ device of claim 1, wherein the top region comprises a well region, a body region of a field effect transistor (FET), or a junction barrier region of a junction barrier Schottky (JBS) diode or a merged PiN Schottky (MPS) diode.

12. The SJ device of claim 1, wherein a switching speed of the SJ device is greater than 1 kHz.

* * * * *